United States Patent [19]

Lefkowitz et al.

[11] Patent Number: 5,367,199
[45] Date of Patent: Nov. 22, 1994

[54] SLIDING CONTACT CONTROL SWITCH PAD

[75] Inventors: Leonard R. Lefkowitz; Albert L. Armstrong, Jr., both of Latham, N.Y.

[73] Assignee: Triax Technologies, Albany, N.Y.

[21] Appl. No.: 944,918

[22] Filed: Sep. 15, 1992

Related U.S. Application Data

[63] Continuation-in-part of Ser. No. 877,077, May 1, 1992, abandoned.

[51] Int. Cl.$^5$ ............................................. A06F 3/02
[52] U.S. Cl. ................................. 307/116; 307/112; 340/517; 340/524
[58] Field of Search ................. 307/112, 116; 340/517, 340/524, 806–807, 549; 200/DIG. 2

[56] References Cited

U.S. PATENT DOCUMENTS 3,757,322  9/1973  Barkan et al. .................. 340/365 C
4,305,007 12/1981  Hughes ............................. 307/116

Primary Examiner—A. D. Pellinen
Assistant Examiner—Aditya Krishnan
Attorney, Agent, or Firm—Young & Thompson

[57] ABSTRACT

A controller is provided which includes a plurality of equally spaced sensors disposed symmetrically about an intersection of at least two orthogonal axes and spaced from such axes by a null zone which is concentric with such sensors. Control circuitry is electrically connected to the sensors to control movement of a controlled object in a direction which is related to the position of an operator's finger and the like relative to such intersection.

33 Claims, 10 Drawing Sheets

SLIDING CONTACT CONTROL SWITCH PAD

RELATED APPLICATION

This is a continuation-in-part of patent application Ser. No. 07/877,077 filed May 1, 1992, now abandoned.

BACKGROUND OF THE INVENTION

1. Field of the Invention

The present invention relates to a touch activated controller which includes a control pad and which permits sliding action control by movement of a finger or thumb upon a surface of the control pad without the need for the operator to lift his finger or thumb from the control pad surface throughout use of the device.

2. Description of the Prior Art

It is well known to use an operator input device to control a cursor or other controlled object on the screen of a cathode ray tube. For example, in the field of computer controls, many devices exist for use in cursor control, including sophisticated proportional movement control devices such as mouse devices, trackballs, light pads, and various types of sensory touch pads. Two known capacitive activated computer control devices are described in Matske et al, U.S. Pat. No. 4,736,191 and Bobick, U.S. Pat. No. 4,103,252. However, computer controls are not particularly adaptable for use in the control of video games since computer control needs differ so significantly from video game control needs. In computer operation, the operator is principally engaged with character entry via keystroke operation of a keyboard and only occasionally must remove his fingers from the character entry keys to operate the cursor movement control keys or some other cursor control device. Under the usual computer operating conditions, the operator tends to direct his attention to cursor movement control intermittently, as the need arises. Typically, the computer operator does not rest his finger on the cursor control device as this would bring about a spurious movement response and interfere with his operation of the keyboard keys. Thus, in computer operation, the typical mode of operation of the cursor controller is momentary and only intermittent.

The operation of some devices, as for example, the operation of video games calls for a different type of movement control. For example, in the operation of video games the operator will constantly have his thumb, finger or hand in contact with the motion control device. An important feature of such devices is that the operator be able to maintain such constant contact with the control device without inducing an unintentional response. For example, during use of the typical joystick used for movement control in video games, the operator will customarily grasp the joystick in some neutral position in preparation for rapid repositioning of the joystick out of the neutral position to bring about the next positive movement control.

Similarly, in the use of rocker motion paddle devices, where electrical switches are activated by mechanically depressing the rocker paddle from a neutral position to cause an electrical switch closure and bring about a movement response in a controlled object, the usual practice is to maintain very low pressure contact with the rocker pad switch surface so that when the next movement is required, the response time is minimized between the perceived need for motion and the activation of the motion-controlling switch pad. A positive feature of mechanical switching devices that require pressure for activation is that one can maintain his finger or hand in contact with the device surface without inducing an unintentional switch closure and response. This feature is very important in the control of video games and the like calling for very rapid motion control. However, problems exist in the use of rocker motion paddle devices. In the control of video games, the present level of development calls for operator input devices which provide four direction or eight direction control over movement of the controlled object on the video screen. Control devices such as four or eight position rocker paddle switch pads and various joystick, trackball, and other mechanically activated devices are well known but such mechanical motion controllers are tiresome to use and limit the speed at which an operator can execute control commands.

Computer control devices which are not of the mechanically activated type are known in the art. For example, U.S. Pat. No. 4,736,191 to Matske et al referred to above is a capacitive activated proportional movement control touch pad for computers. Matske et al show a number of capacitive reactive sensor plates arranged as sectors radiating from the center of a circle. However, the center as well as the surrounding sectors of the Matske et al device contain electrodes for detecting motion. Thus, Matske provides no neutral zone where an operator may rest his finger between various movements. This type of touch activated control device will not work well for video game control because it does not provide for the possibility of continuous contact with the pad surface without inducing unwanted motion response.

U.S. Pat. No. 4,103,252 to Bobick referred to above is another example of a computer control device which is not of the mechanically activated type. Bobick describes proportional control over a controlled object by sensing the relative position of an object and four interdigitated electrodes arranged in a circle along two orthogonal axes. Like Matzke et al, the Bobick device does not include a null zone where an operator may rest his finger without eliciting an unwanted control signal response.

In the use of capacitance activated control devices such as those described in the Matske et al and Bobick patents, a control response may also occur accidentally if the operator's finger unintentionally comes into close proximity to or touches the surface of an electrode. This can occur when the finger approaches the response pad surface from too low a path, as might occur with any of the known capacitive responsive inventions.

Another problem is that in video game play, the operators attention is focused almost entirely on the video display screen rather than on the surface of the game controller pad. Thus a sliding motion touch pad that is completely smooth will provide little information to the game player regarding the position of his finger on the control pad surface.

In considering the control circuitry required to operate devices of the type described herein, there are various means for measuring an electrical capacitance or more specifically a change in capacitance due to the presence of an external object such as a finger placed in the vicinity of a sensor electrode. One known means utilizes the capacitance of a sensor plate as part of an RC oscillator circuit. Placing an object near the sensor plate changes the capacitance of the circuit and hence the frequency of oscillation. Thus the presence or absence of an object near the sensor electrode will be indicated by a change in the frequency. This is the means used in U.S. Pat. No. 4,103,252 referred to above. One problem with this means is that there will be cross-coupling of the various oscillators.

Another known means of measuring capacitance is to apply an electrical voltage step to one end of a resistor which is connected on the other end to a capacitive sensor plate. The current through the resistor charges the capacitive sensor causing its voltage to change in accordance with well known principles of electrical RC circuits. The sensor voltage will change more rapidly with less capacitance and more slowly with larger capacitance, as is the case when an object is near the sensor plate. Thus the timing or more specifically the delay of the voltage change is an indication of an object near the sensor. To provide a useful output signal, the time delay of the signal must be compared to the fixed time delay of a reference circuit. This means is used in U.S. Pat. No. 4,595,913 to Aubuchon.

In view of the foregoing, it is an object of the present invention to provide a touch activated switch pad that will permit sliding action control by movement of an object such as a finger without the need for the operator to lift his finger from the pad between control movements or when moving from one sensory electrode to another.

It is a further object of the present invention to provide such a touch activated switch pad which will enable a user to elicit a control switching response in eight directions through the utilization of only four electrodes.

It is a further object of the invention to provide a sliding contact touch activated switch pad having a central null zone that will accommodate the operator's digit pad thereon without causing a movement response of the controlled object.

It is another object of the invention to provide a controller where the operator's digit pad may be slid from the null zone onto any one of the surrounding electrode pads without the need for lifting the operator's finger from the pad, to accomplish a single final control switching response when only one sensor pad is at least partly covered by an operator's digit pad, and no switching response when the operator's digit pad lies within a centrally located null zone.

Another objective of the invention is to provide a dual final control switching response when any two adjacent electrodes are at least partly covered by a controlling object such as the operator's digit pad.

A further objective of the invention is to provide a sliding contact control interface device where the operator's digit pad can slide about on the control pad surface continuously, eliciting no switching response when the digit pad rests substantially entirely within a defined central null zone, a single final control switching response when the operator's digit pad rests at least partly in contact with a single electrode pad, and a dual final control switching response when the operator's digit pad rests at least partly in contact with any pair of adjacent electrodes.

Another objective of the invention is to provide a sliding contact control interface device within a confined space so that the entire surface of the switch pad can be accessed merely by sliding the digit pad about on the control pad surface, without the need to raise or reposition the operator's wrist from a beginning position.

A further object of the present invention is to provide such a touch activated switch pad which includes a null zone at the center of the pad so that the operator can rest his finger between movement commands without the need to lift his finger from the pad surface.

It is a further object of the present invention to provide such a touch activated switch pad having a surface with patterned contours that are useful in providing the operator with tactile feedback useful in identifying the position of his finger on the pad without the need for visual confirmation.

Another object of the present invention is to provide a touch activated switch pad that is both simple and intuitive to operate.

Yet another object of the present invention is to provide an improved touch activated switch pad for use with a video game.

A further object of the present invention is to provide a touch activated switch pad that is less fatiguing to operate than mechanically operated switching devices.

It is a still further object of the present invention to provide a touch activated switch pad that enables the operator to accomplish faster video game play and speed of response.

Another object of the present invention is to provide a touch activated switch pad that facilitates carrying out complex movements such as circular control action that ordinarily is very difficult to achieve with conventional mechanical rocker pad or joystick controllers.

It is a further object of the present invention to provide a touch activated switch pad which includes control circuitry which does not utilize variable frequency oscillators or signal time delays.

SUMMARY OF THE INVENTION

This invention achieves these and other results by providing a touch activated switch pad, comprising means disposed about an intersection of at least two intersecting axes for conductive engagement by a controlling object. Means is also disposed between such intersection and the conductive engagement means for non-conductive engagement by the controlling object. Means is electrically connected to the conductive engagement means for directing a controlled object in a manner which is dependent upon the position of the controlling object relative to the non-conductive engagement means when the controlling object engages the conductive engagement means.

In the preferred case, the directing means is in the form of a central null zone which is of sufficient size to allow an operator to rest a controlling object thereon without eliciting a final control response in any of the electrodes surrounding the null zone. Furthermore, the conductive engagement means is preferably a plurality of sensors surrounding the null zone which is of such size and disposition that the operator can move the controlling object about from one sensor onto the null zone and then onto any other sensor without causing an unwanted control response from any of the other surrounding sensors.

In certain cases, the controlling object is the digit pad of an operator's finger or thumb; the non-conductive engagement means is a central null zone of sufficient size to accommodate the operator's digit pad thereon without eliciting a final control switch response in any of the surrounding conductive engagement means; and the conductive engagement means is a plurality of capacitive sensing electrodes, each having a null zone facing edge that is wide enough to accommodate the sliding passage of the operator's digit pad from the null zone onto and off of an electrode without causing a switching response in either adjacent electrode.

Additionally, by providing a separate dedicated capacitance sensing circuit for each electrode the invention allows for the simultaneous activation of two adjacent electrodes by placing the operator's digit pad midway between two adjacent electrode pads. When two adjacent electrodes are activated at the same time, a dual switching action occurs, which results in a different response than is achieved when either one of the electrodes is activated alone.

BRIEF DESCRIPTION OF THE DRAWINGS

This invention may be clearly understood by reference to the attached drawings in which.

DESCRIPTION OF THE PREFERRED EMBODIMENT

Figure 1:
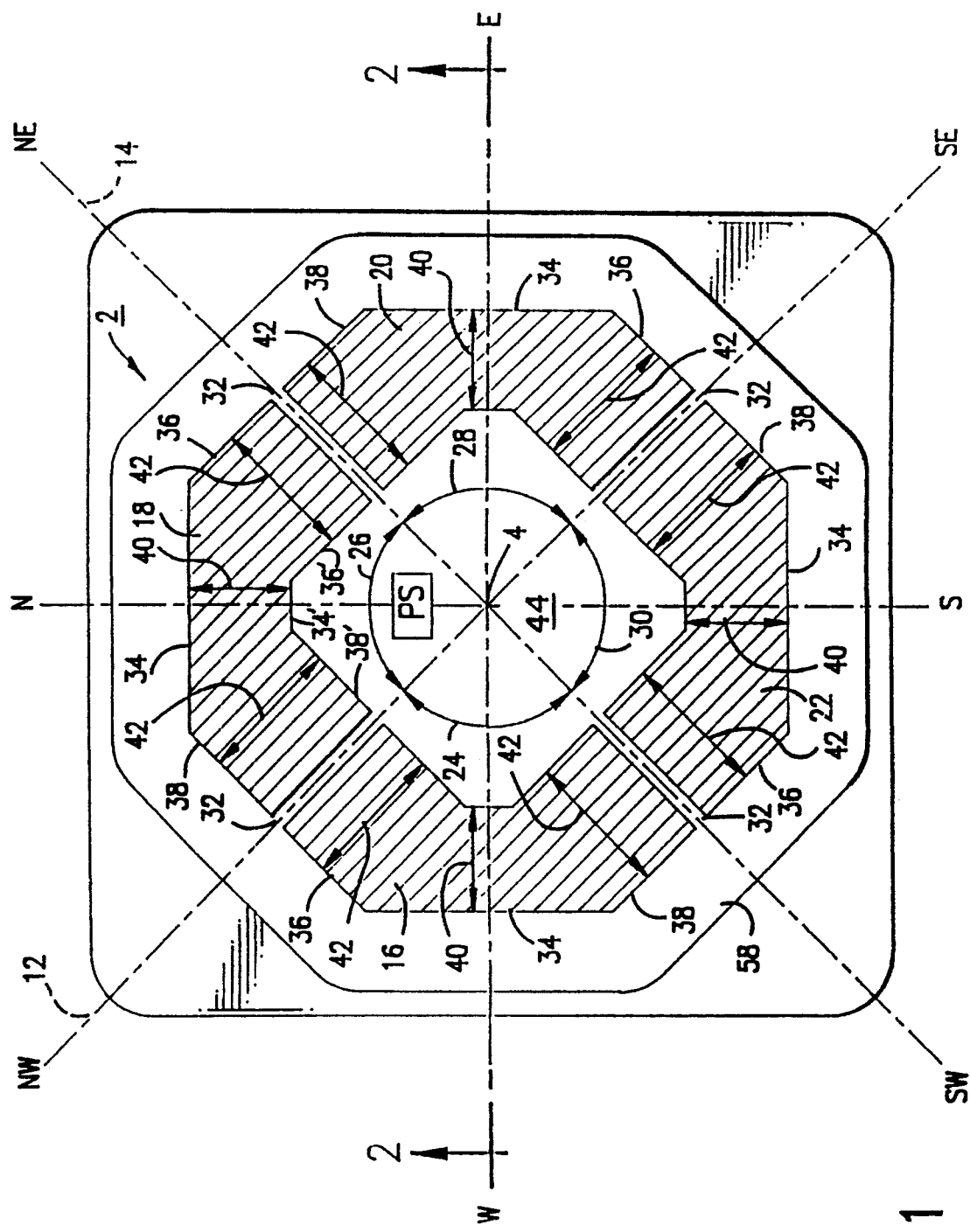
FIG. 1 is a plan view of one embodiment of the present invention.

The present invention relates to a touch activated switch pad which includes means disposed about a point such as an intersection of at least two intersecting axes for conductive engagement by a controlling object. By conductive engagement is meant that the controlling object is brought into operative contact with or operative proximity to a sensor such that the sensor will sense the presence of the controlling object. The touch activated switch pad also includes means disposed between the conductive engagement means and the point or intersection for non-conductive engagement by the controlling object. By non-conductive engagement is meant that the controlling object is brought into contact with a non-conductive area or null zone proximate to the sensor such that the sensor will not sense the presence of the controlling object. The touch activated switch pad also includes means electrically connected to the conductive engagement means for directing a controlled object in a manner which is dependent upon the position of the controlling object relative to the non-conductive engagement means when the controlling object engages the conductive engagement means.

In the preferred embodiment, the touch activated switch pad of the present invention includes a plurality of electrodes and electronics associated therewith which allow an individual to move his finger from a particular electrode to any other electrode either directly by sliding the finger from one electrode to an adjacent electrode, or indirectly by sliding the finger from one electrode and through the null zone to another electrode. The presence of the null zone will permit such movement to take place without unwanted intervening electrode activation or the need to lift one's finger from the switch pad surface. This is possible since all of the path widths over which the finger may be moved to and from each electrode by way of the null zone are of sufficient width to accommodate the passage of the operator's digit pad without causing unwanted electrode response. To this end it is important that the null zone facing side of each electrode be sufficiently wide to allow the finger to slide from the null zone to an electrode without substantially engaging an adjacent electrode. Similarly, the null zone, whether it be elongated, circular, elliptical, or some other configuration, should be wide enough to accommodate the placement and movement of the digit pad thereon without causing unwanted activation of an electrode. It will be apparent that as a result of such constraints, an individual's digit pad can be slid upon the null zone without any electrode response until such time as the digit pad is moved from the null zone onto an electrode.

In the preferred embodiment the individual's digit pad may be positioned upon two adjacent electrodes the effect of which will be to activate a dual electrode response. In other words, two side-by-side electrodes will be simultaneously activated. In such a case, the digit pad is deliberately positioned to straddle across both such adjacent electrodes rather than to engage only one of such electrodes. In such an embodiment, the electrodes will be made sensitive enough to be reactive to the presence of only a part of the digit pad so that a control switching response may be elicited in two adjacent electrodes when the digit pad straddles across both electrodes. Such a dual switching response is particularly effective in (a) reducing the number of electrodes required to accomplish the desired number of switching responses to one half the number normally required, and (b), allowing the size of each electrode to be large in comparison to the amount of space available for a compact arrangement of a sliding contact touch activated switch pad for the control of video games, keyboard cursors, alphanumeric switching devices and the like.

The operator's digit pad size may vary from operator to operator, and may also be varied according the pressure applied to the pad during use. In addition, the sensitivity of the electrodes may vary as well, depending upon adjustments to the circuitry as well as because of other factors, such as the presence of intervening non-conductive layers between the conductive electrode surface and the controlling object surface. However, we have found that a typical operator's digit pad, when being lightly slid over the control device surface of the invention, measures about one half inch. Therefore, in the preferred embodiment when the electrodes are adjusted to optimum sensitivity for reliable control switching response, false triggering of adjacent electrodes will be avoided if the electrodes are at least about one half inch wide and the electrode edge abutting the null zone measures at least about one half inch. Under these conditions, the perimeter of the null zone will be at least equal to the number of electrodes surrounding the null zone times one half inch. For example, in the preferred embodiment a control device with six electrodes will have a minimum null zone perimeter of about three inches. If the device of the example had a round null zone, the diameter would be about one inch.

Figure 2:
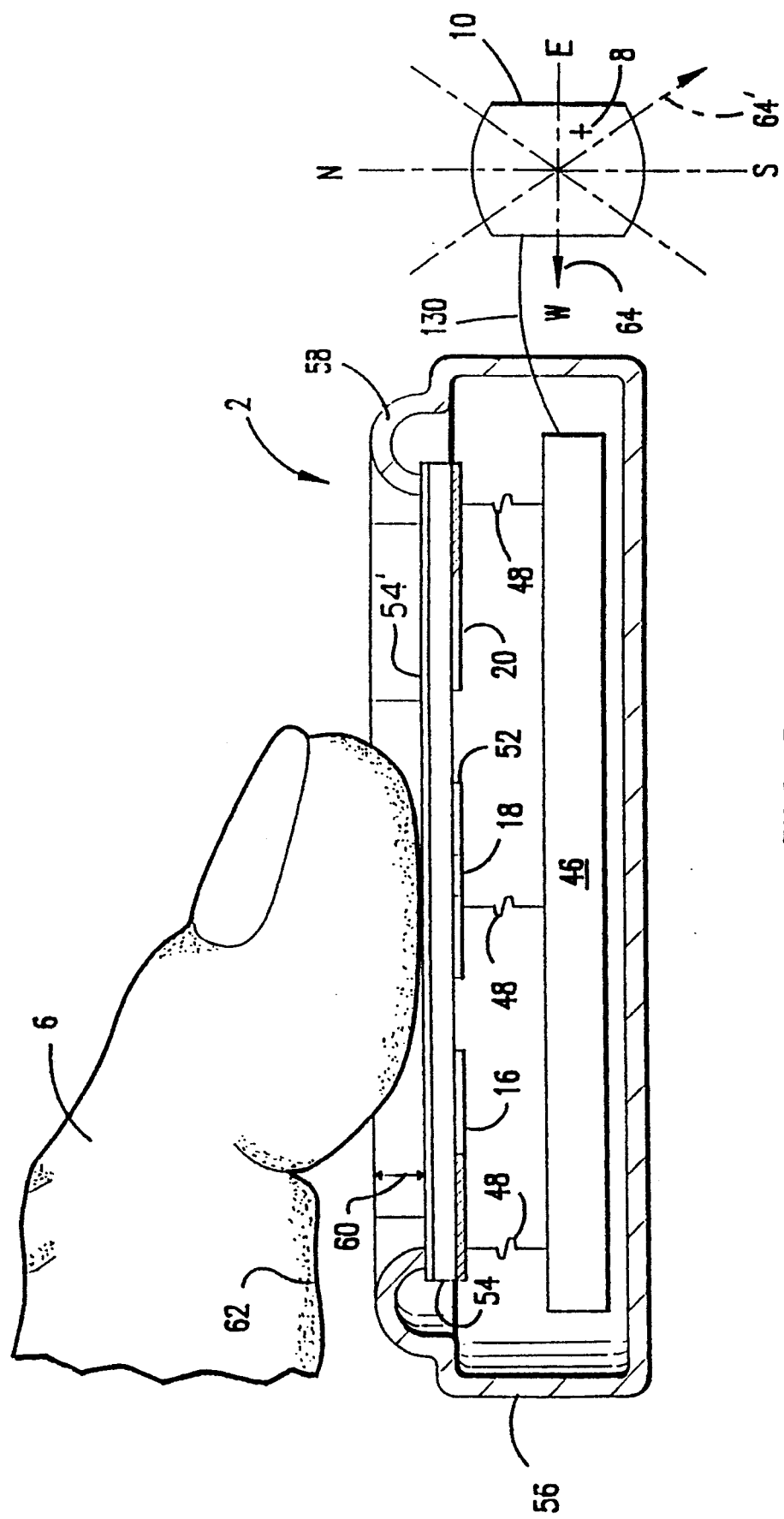
FIG. 2 is an elevational view of FIG. 1 taken along the line 2—2 of FIG. 1.

The embodiment of this invention which is illustrated in FIGS. 1 and 2 is particularly suited for achieving the object of this invention. FIGS. 1 and 2 depict a touch activated capacitance sensing switch pad 2 which includes means disposed circumferentially about an intersection 4 of at least two intersecting axes for conductive engagement by a controlling object 6 to cause movement of a controlled object 8 on the screen of a cathode ray tube 10 in response to such conductive engagement. In the preferred embodiment there are two intersecting axes 12, 14 which are orthogonal as depicted in FIG. 1. In an alternative embodiment, the intersections of at least three equally spaced straight lines may serve as the basis for the switch pad of the present invention. In the embodiment of FIGS. 1 and 2 the conductive engagement means comprises a ring-like configuration of identical capacitive activated sensors disposed symmetrically about intersection 4. Preferably, there are four of such sensors in the form of electrodes 16, 18, 20 and 22. For purposes of clarity, electrode 18 is only partially depicted in FIG. 2. As depicted in FIG. 1, preferably each electrode 16, 18, 20, 22 occupies substantially all of a quadrant 24, 26, 28 and 30, respectively, of the ring-like configuration of sensors, and each electrode is arranged symmetrically about intersection 4. Each of the electrodes 16, 18, 20, 22 of the ring-like configuration of electrodes is separated from an adjacent electrode of the ring-like configuration of electrodes by a non-conductive strip or area 32. Each strip 32 is radially oriented relative to intersection 4 and in the preferred embodiment of FIGS. 1 and 2 each strip 32 is radially oriented along an orthogonal axis 12 or 14. The present invention is for use with any object 6 which will interact with the switch pad of the present invention as described herein. By way of example only, controlling object 6 may be a finger, thumb, hand and the like. For purposes of simplifying the discussion herein reference will be made to a finger 6 it being understood that as noted above the present invention is not limited thereto.

In the preferred embodiment each electrode 16, 18, 20, 22 comprises a base 34, a first segment 36 which extends at a first angle from base 34 and a second segment 38 which extends at a second opposite angle from base 34. Each first segment 36 and each second segment 38 of each electrode extend towards a second segment 38 and a first segment 36, respectively, of an adjacent electrode as depicted in FIG. 1. Preferably, each base 34 has a width 40 which is less than at least a portion 42 of the width of each segment 36 and 38.

Touch activated capacitance sensing switch pad 2 also comprises means disposed concentric with the conductive engagement means and located between the intersection 4 and the conductive engagement means for non-conductive engagement by the finger 6. In the embodiment of FIGS. 1 and 2 such non-conductive engagement means is in the form of a null zone 44. The intersection 4 is located at the midpoint of null zone 44 in the preferred embodiment. Null zone 44 is a non-conductive area which may be approached or touched without being sensed by any of the electrodes and therefore without eliciting movement of the controlled object. As depicted in FIG. 1, in the preferred embodiment the electrodes 16, 18, 20, 22 form an almost continuous ring about null zone 44, each electrode being spaced from an adjacent electrode by a relatively thin area or strip 32. Null zone 44 must be large enough in area so that a controlling object such as a finger may be placed thereon without operatively engaging an electrode.

Each of the electrodes 16, 18, 20 and 22 is of sufficient size to accommodate the placement of an operator's finger thereon without causing a final control switching response in another electrode. In addition each of the inner electrode sides which collectively define the perimeter of the null zone 44 to enclose the null zone is of sufficient size to accommodate the sliding passage of the operator's finger to and from an electrode without causing a final control switching response in an adjacent electrode. For example, in the embodiment depicted in FIG. 1, each inner electrode side includes segments 34', 36" and 38' and each such inner electrode side will be of sufficient size to allow an operator's finger to slide from the null zone 44 to a respective electrode 16, 18, 20 and 22 without operatively engaging an adjacent electrode. It has been found that when the null zone facing side of each electrode has a perimeter of about at least one half inch, the finger may be slid on and off of the electrode without causing any unwanted control switch response in an adjacent electrode. With the foregoing considerations in mind, in the preferred embodiment the four electrode device will have a minimum null zone perimeter of two inches, and if the null zone is circular its diameter will be about two thirds of an inch.

In the preferred embodiment, only a portion of the operator's digit pad must cover the electrode being triggered. For example, the operator need only cover the middle part 34 of electrode 16, to elicit a final control switch response in electrode 16. If more of the electrode is covered, there will be no further change in response. This level of sensitivity in the control response is of importance when it is desired that two adjacent electrodes be activated by placing a part of the finger pad above each of two adjacent electrodes at the same time. For example, when the operator's digit pad is centered above the relatively thin non-conductive strip 32 between adjacent electrodes 20 and 22, that part of the finger pad above each electrode need only be sufficient to trigger a final control switch response in both of these electrodes. When the control device is used to accomplish movement control, the dual switching response is interpreted by the associated electronic circuitry to bring a movement response that is mid-way between the direction response that would have been initiated if only electrode 20 or 22 were activated.

If desired, the null zone can include one or more pressure activated switches PS which are not responsive to low pressure contact with the operator's finger but provide an independent switch response when pressure is applied. Such switching means are well known in, for example, the video game art, and will therefore not be described in further detail herein.

Touch activated capacitance sensing switch pad 2 also comprises means electrically connected to the conductive engagement means for directing movement of the controlled object 8 on the screen of cathode ray tube 10 in a direction which is dependent upon the position of the finger 6 relative to the null zone 44 when the finger is in conductive engagement with the conductive engagement means. In FIG. 2, the directing means is diagrammatically depicted as control circuitry 46. Control circuitry 46 is connected to each sensor 16, 18, 20, 22 by separate insulated conductors 48 and to the cathode ray tube by corresponding conductors collectively depicted in FIG. 2 by line 50.

In the preferred embodiment, electrodes 16, 18, 20 and 22 are attached to the lower side 52 of an upper surface 54 of a housing 56. Upper surface 54 includes a thin facing layer 54' which preferably is a low friction plastic sheet. The low friction plastic promotes ease of finger movement which is a particularly important feature when the finger is being slid about from position to position on the pad. In this embodiment the finger 6 does not come into direct contact with the electrodes although it will be apparent to those skilled in the art that if desired the switch pad can be modified for direct engagement of the electrodes by finger 6 by the removal of the facing layer 54' and the positioning of the electrodes at the upper side of the upper surface 54 depicted in FIG. 2.

In the preferred embodiment the conductive engagement means is disposed between the non-conductive engagement means and means which is adjacent to the conductive engagement means for preventing an operator's finger from undesired conductive engagement with the conductive engagement means. For example, in the embodiment of FIGS. 1 and 2 the conductive means, which is in the form of electrodes 16, 18, 20 and 22, and the non-conductive means, which is in the form of the null zone 44, are part of the upper surface 54 of the housing 56. The means for preventing such undesired conductive engagement is in the form of a rim 58 which is raised a distance 60 relative to upper surface 54. Rim 58 extends about an outer periphery of the housing 56. As can clearly be seen in FIG. 1, and with respect to a radial direction relative to intersection 4, the electrodes 16, 18, 20 and 22 are disposed between the null zone 44 and the raised rim 58, raised rim 58 being concentric with the electrodes and the null zone. The raised rim 58 is useful in preventing any part of the operator's finger other than the end portion of the finger from coming into close proximity with or contacting the electrode surface. Such close proximity or contact would otherwise cause unintentional electrode activation and movement response of the controlled object 8. For example, were there no elevated border such as rim 58 to prevent it, the operator could inadvertently bring the part of the finger shown at 62 in FIG. 2 into conductive engagement with electrode 16 thereby causing unintentional movement of the controlled object 8, in the direction designated 64. Rim 58 is also useful in limiting motion of the finger relative to the electrodes which is an important consideration during rapid play action. It should further be noted that by providing a rim 58 which is preferably octagonal in plan view as depicted in FIG. 1, positional guidance through tactile indication of each of the eight directions of movement as described herein may be provided.

Figure 3:
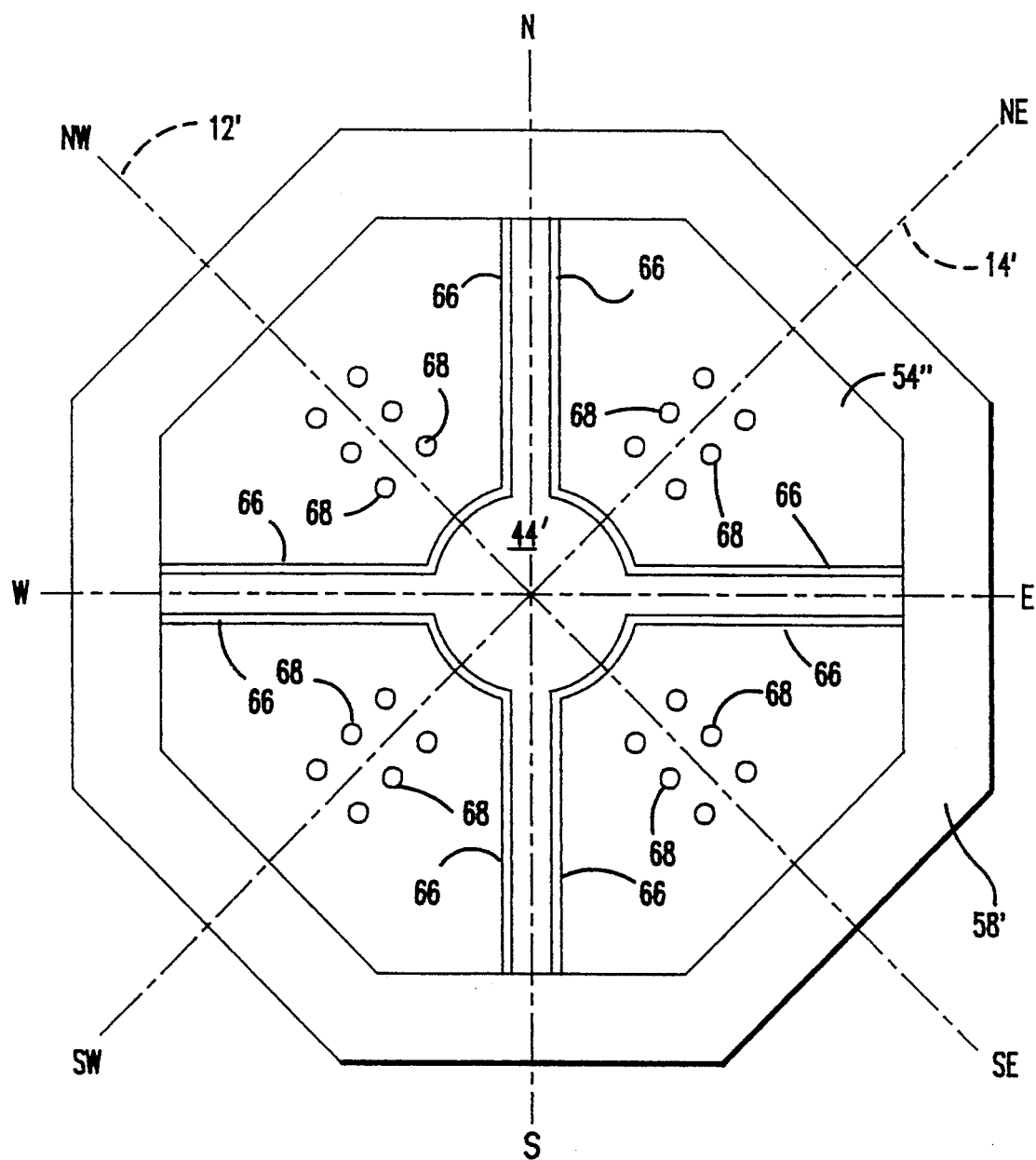
FIG. 3 is a plan view of another embodiment of the present invention.

In the preferred embodiment, the touch activated capacitance sensing switch pad 2 comprises further means adjacent upper surface 54 for guiding an operator's finger relative to the conductive engagement means. For example, in the embodiment of FIG. 3 which illustrates an alternate switch pad upper surface 54'' such guiding means is provided in the form of a plurality of protuberances such as, for example, raised ribs 66 which are selectively disposed upon the upper surface 54''. In addition, a plurality of indentations such as, for example, indented dots 68 is selectively disposed upon the upper surface 54''. It should be noted that the selection of protuberances versus indentations and the orientation depicted in FIG. 3 are by way of example. In other words, elements 66 and 68 may all be in the form of protuberances, indentations, or a mixture of the two as depicted in FIGS. 3, and can be oriented in any desired direction. In the preferred embodiment elements 66 will be in the form of raised ribs and elements 68 will be in the form or raised dots. However, if desired, raised ribs may be provided for certain directions and indentions for other directions to assist the operator in knowing where his finger is relative to the pad surface. Alternatively, prominent and less prominent surface texturing may be used to provide such operator assistance.

By selectively providing upper surface 54'' with raised areas and/or indented areas a tactile pattern may be provided which will indicate to an operator by sense of feel the location of the null zone 44', the orientation of the axes 12', 14' and any other locations as may be desired such as the North (N)-South (S) and East (E)-West (W) axes of FIG. 3. Such raised or indented areas provide tactile feedback to the operator during game play without the need for him to shift his view from the video screen display. It should be noted that the rim 58' may also be provided with a tactile pattern such as select raised or indented area, if desired. In the preferred embodiment of FIG. 3, pairs of raised lines or ribs 66 radiate outwardly from the switch pad center null zone 44' in the four principal directions of movement; that is, North (N), South (S), East (E) and West (W). In between, pairs of raised lines of dots 68 extend at 45° to the principal axes along orthogonal axes 12', 14'. In this manner the eight octagonal directions N, S, E, W, NE, SE, NW and SW may be easily located by the presence of such identifying marks in the surface of the switch pad.

The null zone 44, located in the center of the array of electrodes 16, 18, 20, 22 is at least large enough to accommodate the controlling object such as the operator's finger so that moving the finger over the null zone produces no signal or only a minimum response signal which is well below the threshold level needed to trigger a switch activation and bring about a movement response of the controlled object 8. For example, with user's finger 6 in contact with the surface of the null zone 44 as shown in FIG. 2, no triggering signal will be generated and no movement response will take place.

Operation of the present invention will now be described with respect to the embodiment of FIGS. 1 and 2 when the touch activated capacitance sensing switch pad is in use with a video game which involves movement of controlled object 8 on the screen of cathode ray tube 10. During game play, the operator may rest his finger within the null zone 44 without causing movement of the controlled object 8. He can then slide his finger quickly to the desired electrode to bring about movement response of the controlled object. For example, the operator can slide his finger off null zone 44 and onto electrode 16 to cause a switching response in the dedicated circuit of electrode 16 and bring about leftward (W) movement of the controlled object in the direction 64. Similarly, to move from left to right rapidly, the operator would merely slide his thumb from electrode 16 to electrode 20, sliding over neutral zone 44 without causing any unintentional disturbance to the movement desired. Because the operator can rest his finger within the null zone of the controller surface at any time, he will not tire during sustained operation of the controller. In addition, since merely the presence of the operator's finger above an electrode in conductive engagement thereto is all that is needed to bring about a control response, there is no muscle strain involved with device operation. Because of these features, the operator will experience very little fatigue in operation of the controller, there being no need to disengage his finger from the touch pad surface between control movements while waiting to make the next move, or while moving from one control position to the next. Alternatively, the operator may choose to elect movement responses by lightly touching or tapping the surface of each electrode, according to his own preference in using the controller. The operator may also actuate a pressure sensitive switch when desired to actuate some function of the video game.

When diagonal movement is desired, the operator will slide his finger to a position midway between two adjacent electrodes so that his finger covers at least a portion of both adjacent electrodes to cause a switching response in the control dedicated circuitry associated with each respective adjacent electrode, such switching action bringing about movement of the controlled object on the screen of the cathode ray tube in a direction which corresponds to the direction of orthogonal axis 12 or 14, depending on which pair of adjacent electrodes are being activated. For example, to move downward and to the right from a previous position on electrode 18, when viewing FIG. 1, the operator merely slides his finger downward off electrode 18 and onto null zone 44 to cause a stoppage in upward (N) movement of the controlled object 8 after which he continues to move his finger to a position midway between electrodes 20 and 22, thereby covering a significant portion of both of these electrodes, to cause a switching response in the sensory circuits of both electrodes 20 and 22, the combination of switching responses in these two circuits being interpreted by the associated electronic circuitry to bring about a movement response of the controlled object 8 that is both downward and to the right with respect to null zone 44 in a direction 64'. Alternatively, to execute the same movement, the operator could choose to slide his finger around in a clockwise direction about the periphery of the controller, passing first from electrode 18 to midway between electrodes 18 and 20, then sliding onto electrode 20, and finally arriving at the desired position in contact with both electrodes 20 and 22. If the operator decided to follow this manner of movement control, the path of the controlled object 8 would appear to rotate clockwise somewhat before beginning to move in the prescribed direction 64'. Movement in the other directions described herein is effected in a similar manner by conductive engagement with the sensor or adjacent sensors associated with each such direction. In particular conductive engagement with sensors 16, 18, 20 and 22 will cause movement of the controlled object in the West, North, East and South directions, respectively, and conductive engagement with pairs of sensors 16, 18; 18, 20; 20, 22; and 22, 16, will cause movement of the controlled object in the Northwest, Northeast, Southeast, and Southwest directions, respectively.

The control device of the invention differs significantly from other devices in that it offers the operator a choice of how he can move the controlled object about, as illustrated by this example. This added flexibility is another key advantage to the invention.

To avoid unintentional signal response when resting the finger within the null zone, it is necessary that the null zone be of sufficient size to allow the finger to clear the electrodes and avoid false triggering. However, to optimize speed of response, it is necessary that the null zone be comparatively small, to provide the high reaction speeds needed for best game play response. In view of these two opposing constraints, it has been found that a null zone width (FIG. 1 embodiment) or diameter (FIGS. 4 and 6 embodiment) of no less than 0.5 inch and no more than 2.0 inches is preferred for maximum accuracy, speed of response, and minimum fatigue during use. In the preferred embodiment of FIG. 1 the width of the null zone is about 0.75 inches. It is also preferred that the electrodes 16, 18, 20 and 22 extend a distance less than about 0.5 inch beyond the null zone, preferably about 0.375 inch.

Figure 4:
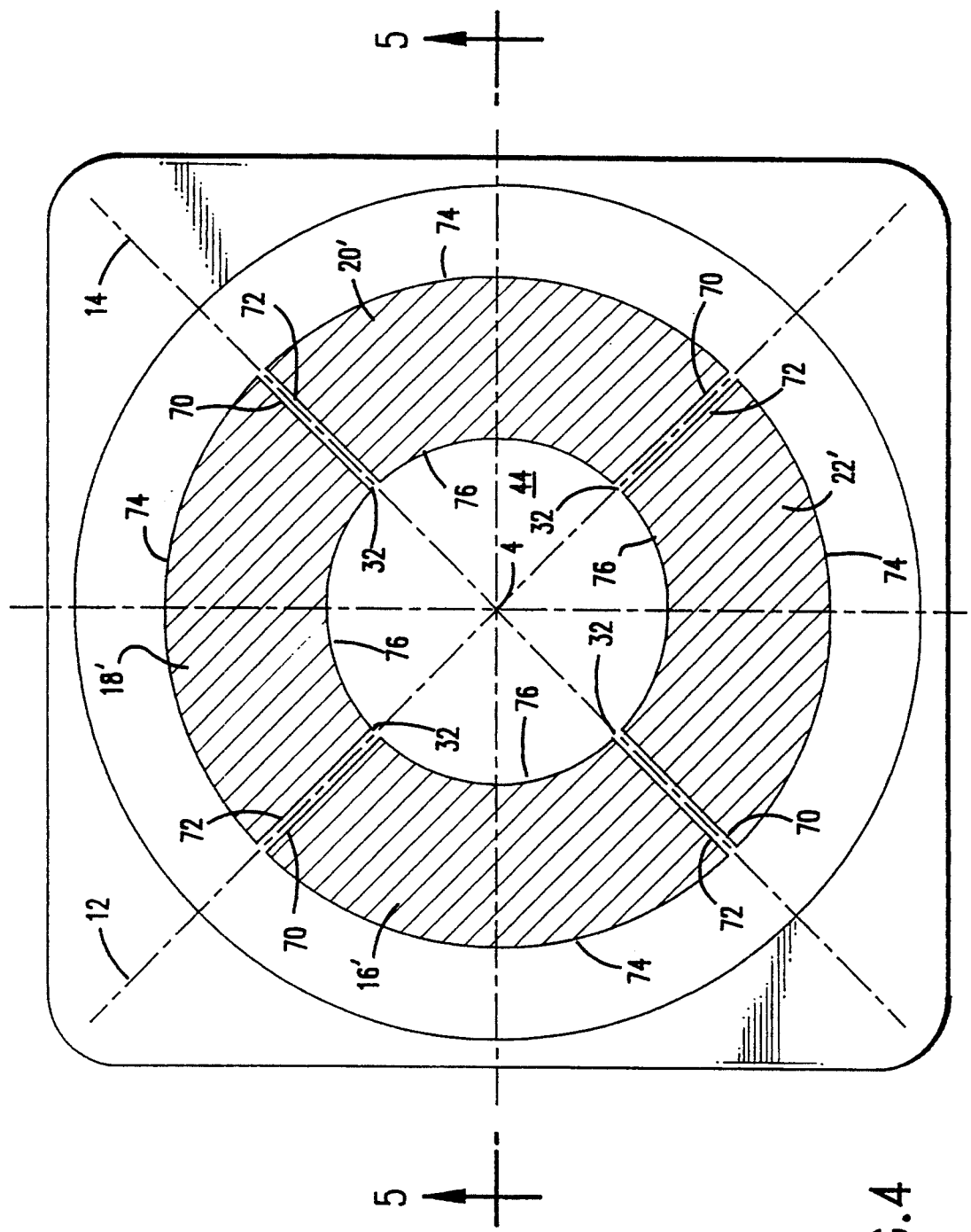
FIG. 4 is a plan view of another embodiment of the present invention.
Figure 5:
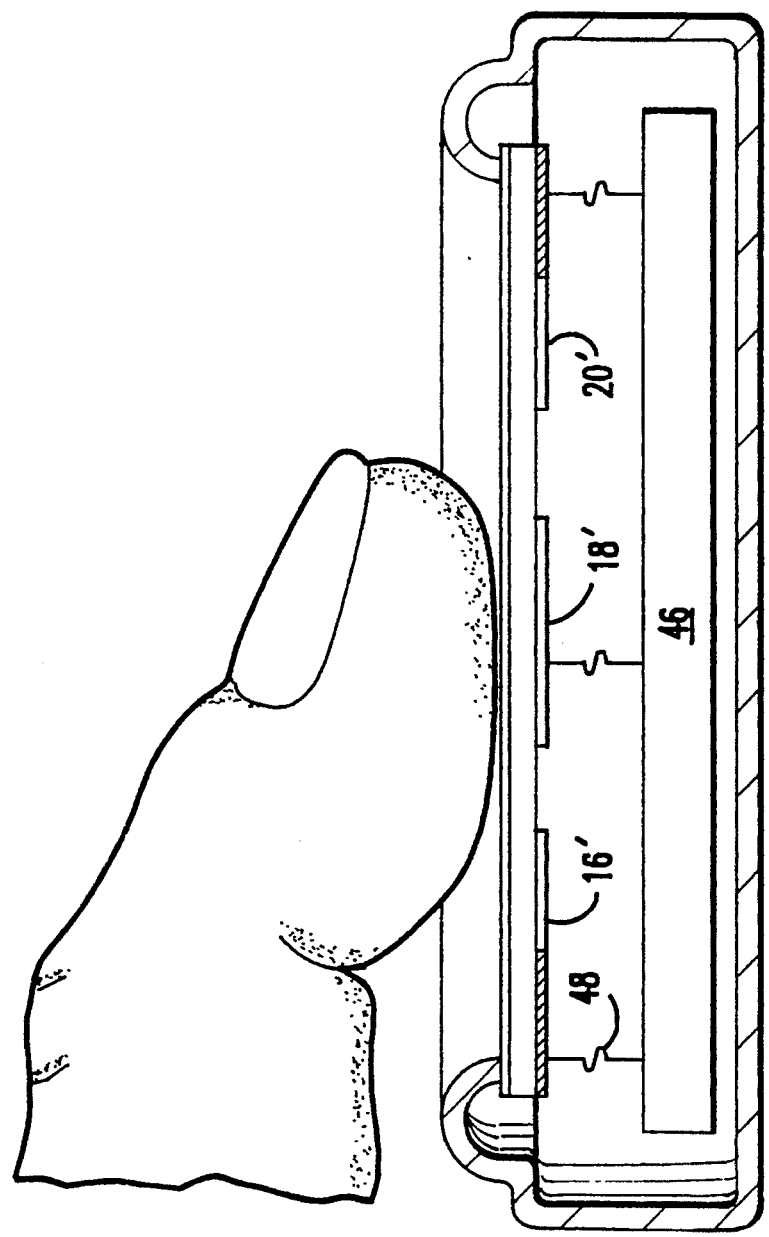
FIG. 5 is an elevational view taken along the line 5—5 of FIG. 4.

The alternative embodiment of FIGS. 4 and 5 is identical to the embodiment of FIGS. 1 and 2 except for the configuration of the sensors and therefore with the exception of the sensors like elements have like reference numerals. In the embodiment of FIGS. 4 and 5 four sector shaped electrodes 16', 18', 20', 22' are provided. For purposes of clarity, electrode 18' is only partially depicted in FIG. 5. Each electrode is bounded by two radii 70, 72 and included arcs 74, 76 of a circle. Each radii 70 of each electrode is equally separated from an adjacent radii 72 by the non-conductive strip or area 32 which is radially oriented relative to intersection 4.

Figure 6:
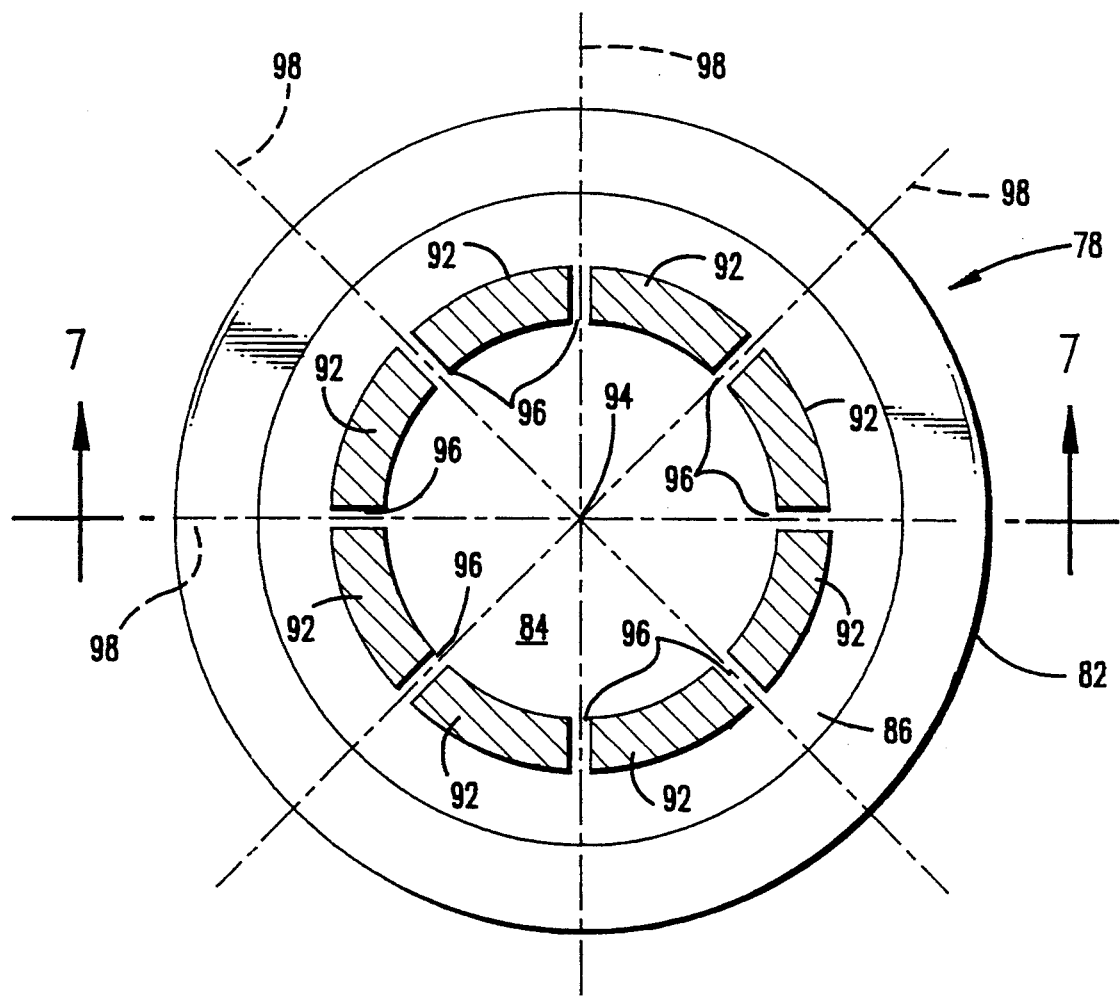
FIG. 6 is a plan view of another embodiment of the present invention.
Figure 7:
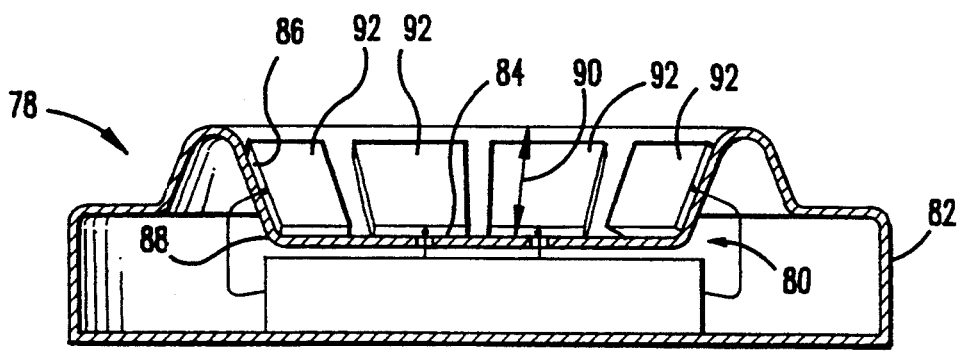
FIG. 7 is an elevational view taken along the line 7—7 of FIG. 6.

In the alternative embodiment of FIGS. 6 and 7, a touch activated capacitance sensing switch pad 78 is provided wherein the conductive engagement means and the non-conductive engagement means are part of an upper surface 80 of a housing 82. The upper surface 80 includes a base region 84 and a rim region 86. Rim region 86 extends vertically about a periphery 88 of the base region 84 and is elevated a distance 90 relative to the base region 84 as depicted in FIG. 7. The non-conductive engagement means is in the form of a null zone which comprises the base region 84. The conductive engagement means extends in a vertical plane and comprises a plurality of electrodes 92 which are part of the raised region 86. The electrodes 92 are disposed circumferentially about an intersection 94. Each electrode is separated from an adjacent electrode by a non-conductive strip or area 96 which is radially oriented as depicted in FIG. 6 relative to intersection 94. In this embodiment, the size of the base region 84 which forms the null zone should exceed the thickness of an operator's finger and should preferably be about one to two inches in diameter since smaller sizes may be prone to errors and larger sizes may result in a slower response time for the device. Although not necessary, in the embodiment of FIGS. 6 and 7 the conductive means comprises eight electrodes 92 symmetrically disposed about four equally spaced apart intersecting axes 98. Each electrode is separated from an adjacent electrode by the narrow non-conductive strip 96. It should be noted that in the embodiment of FIGS. 6 and 7, as well as the embodiments of FIGS. 1 to 5, more or less than the number of sensors or electrodes and axes depicted can be provided although it is preferred that the conductive engagement means comprises at least four electrodes disposed about two or more orthogonal intersecting axes.

In the preferred embodiment, the directing means is in the form of electronic control circuitry which includes means electrically connected to each sensor for producing (a) a first output signal when a controlling object is in conductive engagement with a sensor, and (b) a second output signal when the controlling object is not in conductive engagement with a sensor. Preferably, one output signal will be a logic high signal and the other output signal will be a logic low signal. For example, in FIGS. 8 to 10, the directing means 46 is depicted in the form of electronic control circuitry which includes means electrically connected to each sensor pad 16, 18, 20 and 22 for producing a high logic-level signal designated 125, having a value of 2.5 VDC or greater when the controlling object is not in conductive engagement with a sensor, and a low logic-level signal designated 126, having a value of 0.8 VDC or less when the controlling object is in conductive engagement with the sensor.

Figure 8:
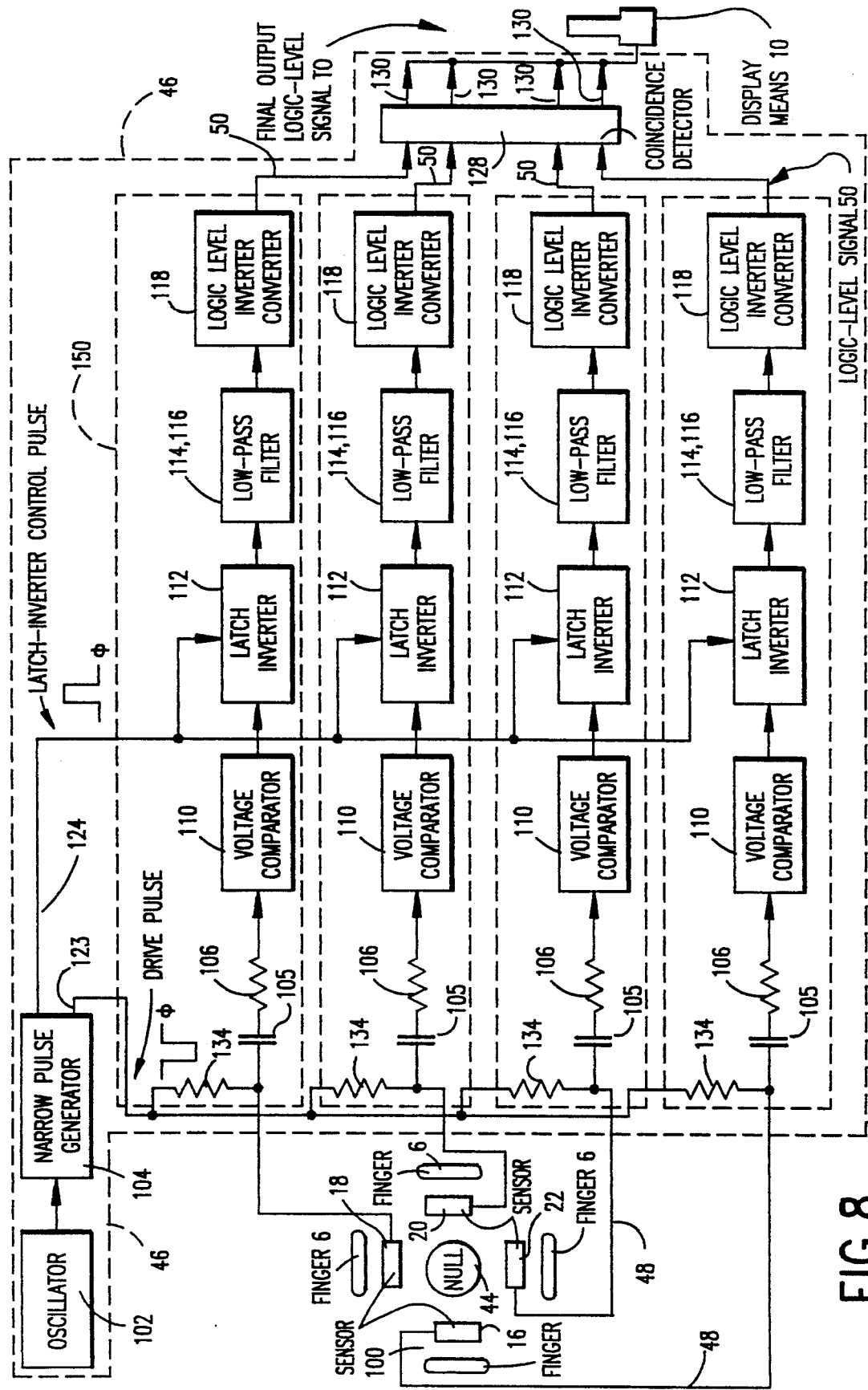
FIG. 8 is a block diagram of the circuity of one embodiment of the present invention.

In the preferred embodiment, the control circuitry 46 provides means for producing (a) a final first output signal when a controlling object is in conductive engagement with a sensor or a pair of adjacent sensors, and (b) a final second output signal when the controlling object is not in conductive engagement with a sensor or pair of sensors. In control circuitry 46 the output of an oscillator 102 is connected to the input of a narrow-pulse generator 104 which may be, for example, a 74221 integrated circuit chip. Generator 104 produces a narrow time-delineated positive going voltage pulse 124 and a narrow time-delineated negative going voltage pulse 123. Pulse 123, which is the drive pulse, is connected to resistors 134 each of which is connected to a respective sensor 16, 18, 20 and 22 as depicted in FIG. 8. A respective capacitor 105 is connected between a respective resistor 106 and a respective sensor 16, 18, 20 and 22. Each resistor 106 is also connected to the input of a respective voltage comparator 110 as depicted in FIG. 8.

Figure 10:
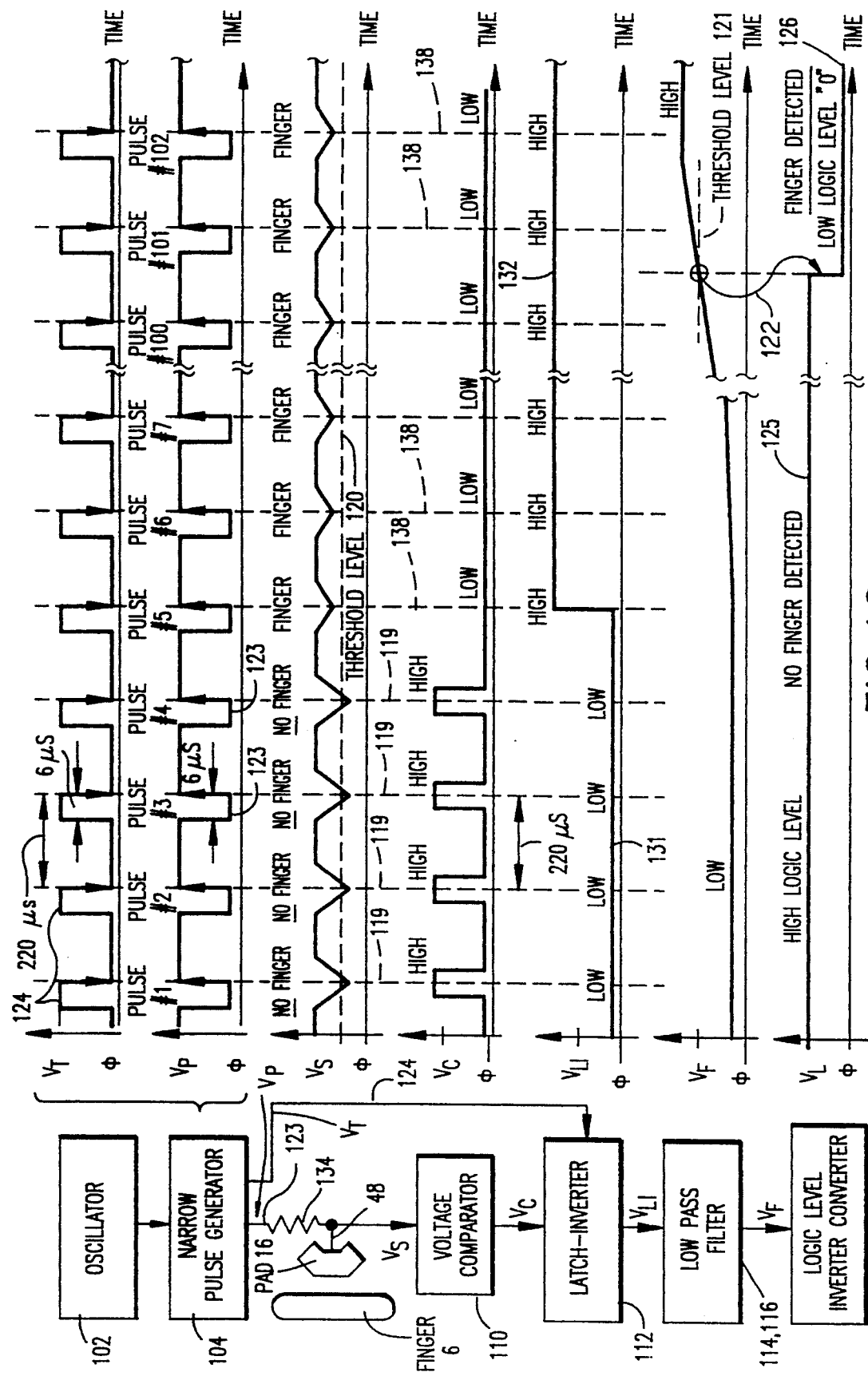
FIG. 10 is a timing diagram of one embodiment of the present invention.

In the embodiment thus far described, a narrow negative voltage pulse is applied through a resistor to the sensor pad whose capacitance is increased by the presence of a controlling object. The voltage of the sensor pad will decrease due to the current through the resistance 134 caused by the negative voltage drive pulse 123. The rate of change of the pad voltage is proportional to the capacitance of the pad. With no controlling object near to the sensor pad, the pad capacitance will be at the minimum value and the voltage will decrease rapidly. The voltage of the sensor pad $V_S$ is compared to a threshold voltage 120 by a comparator circuit 110 and if the pad voltage goes more negative than the threshold voltage, the comparator output goes to a high state 119. Conversely, if there is a controlling object 6 near the sensor pad, the sensor pad capacitance is larger and the rate of decreae of the pad voltage during the negative drive pulse is less and the pad voltage $V_S$ may not reach the threshold voltage value 120 during the time of the pulse and thus the comparator output will remain in the low logic state 138. Capacitor 105 and resistor 106 are optional and for this discussion, sensor pad 16 can be assumed to be connected directly to the negative input of the comparator 110. With reference to FIG. 10, if there is a controlling object 6 in near proximity to or in contact with the sensor electrode 16, then application of a narrow negative drive pulse $V_P$ to the resistor 134 will not, during the time of the pulse, change the voltage of the sensor electrode $V_S$ enough to produce a voltage high state out of the voltage comparator 110. Conversely, if there is no controlling object 6 near the sesnor pad 16 during the drive pulse the sensor voltage will decrease more rapidly and exceed the threshold voltage 120 and produce a comparator output high state 119.

The output of each voltage comparator 110 is connected to a respective latch inverter 112. Pulse 124 is also connected to the latch inverter 112 and is used to update the latch output at the end of each pulse. That is, the output state $V_C$ of the voltage comparator 110 is latched and inverted at the time of the end of the pulse 124 which is also the end of the drive pulse 123. The drive pulse is typically 6 microseconds long and has a repeat period of about 220 microseconds. Thus the latch inverter output VLI is updated every 220 microseconds. The purpose of the latch is to provide a signal which indicates the presence of a controlling object as of the most recent sampling. Such signal is connected to an input of a respective low pass filter 114, 116 which has an output connected to a respective logic level inverter converter 118 each of which has an output connected to respective inputs of a coincidence detector 128 the outputs of which are connected to a cathode ray tube 10. Of course, it will be apparent that any other motion monitoring mechanism may be substituted for the cathode ray tube 10.

Whereas all prior art of which we are aware embody a directing means in the form of electronic capacitance sensing circuitry and means whereby a proportional control signal measuring either voltage, charge or current, is derived which indicates the state of the conductive engagement of a controlling object with a sensor, the preferred embodiment described herein makes cognitive use of a voltage comparator to provide a logic high or low level in response to the voltage level of the sensor electrode relative to a threshold voltage at a sampling time. As a result of this approach, a discrete two-state control signal designated 131, 132 is able to be generated which both eliminates the need for proportional signal control as embodied in the prior art and at once renders the means of this embodiment truly digital in character. The result of such innovation is vastly improved reliability, predictability and design simplicity.

Figure 9:
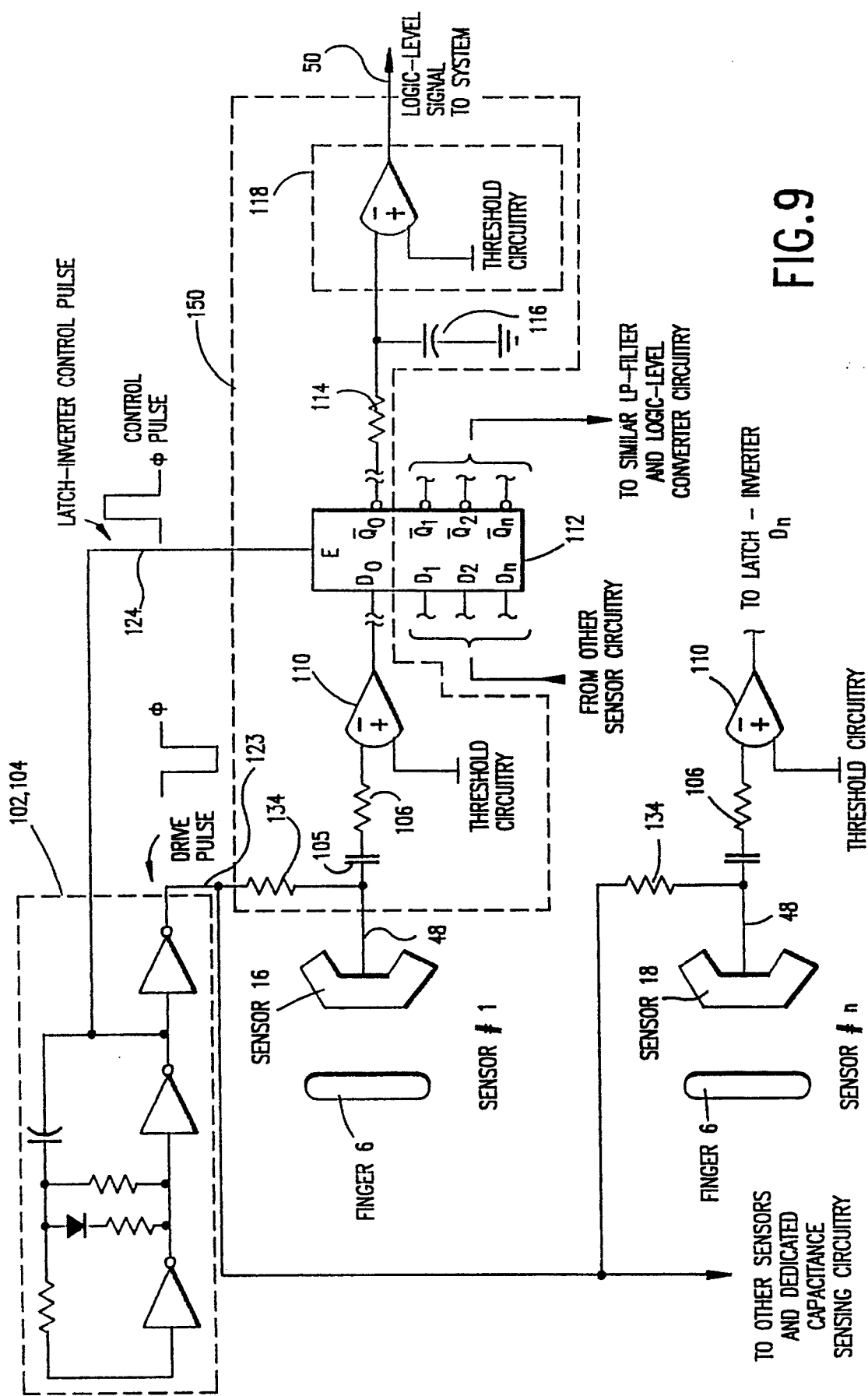
FIG. 9 is a circuit diagram of the circuitry of an embodiment of the present invention.

In the preferred embodiment depicted in FIGS. 8 and 9, the control circuitry 46 comprises a plurality of dedicated capacitance sensing circuits 150, each dedicated capacitance sensing circuit 150 being electrically connected to a respective sensor 16, 18, 20 and 22 and each dedicated capacitance sensing circuit 150 producing a final first output signal when a controlling object is in conductive engagement with a respective sensor, and a final second output signal when the controlling object is not in conductive engagement with a respective sensor. Each dedicated capacitance sensing circuit 150 includes a resistor 134 electrically connected to a respective sensor. In the preferred embodiment each dedicated capacitance sensing circuit 150 also includes means for preventing occasional noise input at a respective sensor from affecting final-output signals. For example, in the embodiment of FIGS. 8 and 9 such preventing means is a voltage-time integrating low-pass filter 114, 116. In the preferred embodiment, each dedicated capacitance sensing circuit 150 includes means for sampling periodically the state of the switch pad and providing an output signal state that is representative of the time average of more than 10 consecutive samplings. For example, in the embodiment of FIGS. 8 to 10 each dedicated capacitance sensing circuit 150 includes means for providing a plurality of output signals each the result of time averaging, via a low pass filter, of more than 10 samplings of the respective sensor pad, such samplings made by applying a narrow negative voltage pulse to the sensor pad through a resistor and latching the condition of whether or not the pad voltage exceeded a threshold voltage at the end of the pulse, the final output value of said final first-output signals and the final second output signals being dependent upon the cumulative results of the voltage-time integration of said samplings. In the preferred embodiment, each dedicated capacitance sensing circuit 150 also includes means for excluding signals representing unwarranted activation of one or more of the sensors 16, 18, 20, 22 as well as means for excluding signals representing the coincident activation of more than two physically adjacent sensors and/or opposing sensors.

To prevent occassional noise input at the respective sensor from affecting output signals, the steady-state logic levels VLI 132 or 131, either high or low respectively, are applied to a voltage-time integrating low-pass filter 114, 116. The purpose of this circuitry associated with each sensor channel is to remove occasional noise pickup and eliminate outside interference which may constitute a source of error. The effect of such noise filtering is to greatly increase the reliability and predictability of the preferred embodiment. Typically the low pass filter will have a time constant of about 0.01 seconds which is about 45 times longer than the 220 microsecond drive pulse period. Thus an occasional noise signal of the wrong state will not affect the output state of the low pass filter $V_F$, but a continuous change of state for about 10 or 20 pulse periods will change the output state of the low-pass filter $V_F$.

The logic level inverter-converter 118 in FIGS. 8, 9 and 10, continuously monitors the output from the low-pass filter $V_F$ 114, 116, and compares this slowly varying voltage value to a fixed threshold reference voltage 121 which is inherent to logic devices. Whenever the low-pass filter signal voltage output $V_F$ equals or exceeds this predetermined level at 122, the logic level inverter-converter circuitry translates this into a low logic-level signal 126 at its output $V_L$ 50. This state is representative of a condition in which an object such as a finger is acting as a controlling object in conductive engagement with an associated sensor electrode. When the finger is subsequently removed from the sensor electrode and is no longer in conductive engagement with it, and a sufficient number of pulse samplings has occurred (about 10 or 20), the logic level inverter-converter will respond to the reduced level of $V_F$, the low-pass filter output voltage, by comparing its value to the fixed threshold voltage reference 121 and, if this is less than the reference value, translate this signal $V_F$ into a high logic-level signal 125 at its output $V_L$ 50.

It will be seen that a low logic-level signal $V_L$ at 50, 130 constitutes a "triggered" sensor electrode and a high logic-level signal $V_L$ at 50, 130 represents a "non-triggered" or "null" condition at the associated sensor electrode. The logic-level signals $V_L$ associated with each sensor electrode, are now directed through coincidence-detector 128, which disallows simultaneous "triggered" states of certain electrode combinations such as "left sensor" and "right sensor". This precautionary circuitry removes the possibility that inadvertently triggered sensor electrode combinations could result in the unintended motion of a controlled object 8. The conditioned logic-level outputs 130 constitute the final output logic-level signals provided by the electronic control circuitry of this embodiment and are consistent with the intended design of this invention.

The discussion above regarding the response of the control circuitry to a given sensor electrode is equally applicable to any of the electrodes 16, 18, 20 and 22, or any pair of adjacent electrodes, in combination with their respective dedicated capacitance sensing circuit 150. In addition, although not indicated on the drawings, it is assumed that suitable power supplies are provided and properly connected to all operating components, preferably from a single source of such power.

It is apparent from the foregoing discussion that each electrode is electrically connected to a dedicated capacitance-sensing circuit 150 which results in a switching logic-level response when that electrode is closely approached or touched by the operator's finger for a sufficiently long period of time (greater than 10 drive pulses $V_P$). This state change in turn causes a corresponding movement of a controlled object 8 on a video screen 10. The presence of a central "null" zone 44 enables the operator to either rest his finger on the touch pad surface 44 between moves, or slide his finger about on the control pad without causing unwanted control signals. A movement response is initiated when an operator's digit pad contacts or comes into close proximity to one single electrode 16, 18, 20 or 22, or two adjacent electrodes 16–18, 18–20, 20–22 or 22–16. In the preferred embodiment, four electrodes provide movement control in eight directions. Where more precise movement control is needed, the number of sensor electrodes may be increased.

The application of the invention is not restricted to movement control only, but may prove useful for other needs as well. For example, the sliding contact control switch of the invention may be useful where currently employed switch types cause undue fatigue or distress. Such may be the case with handicapped individuals, where the need may exist to provide means of eliciting as many as eight switch responses to the limited movement of a body extremity. The present invention may also be useful in computer control applications, as for example, those prior art computer control applications discussed herein.

Figure 11:
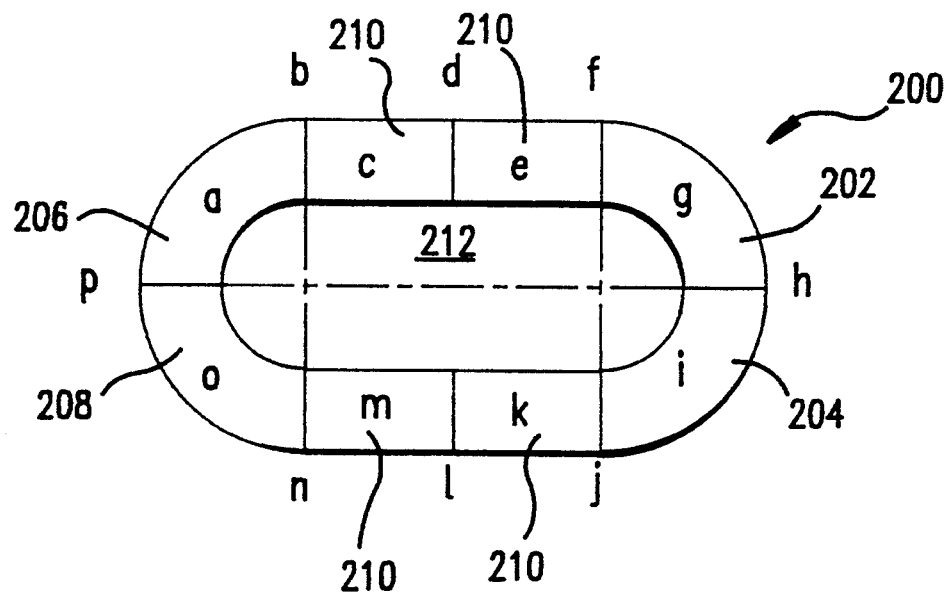
FIG. 11 is a view of another embodiment of the present invention.

In the example shown in FIG. 11, a racetrack shaped sliding contact touch pad controller 200 of the invention is shown, having a semi-circular pair of electrodes 202, 204 and 206, 208 at both ends surrounding an elongated null zone, with electrodes 210 spaced about the connecting line between semi-circular ends at a distance which permits sliding motion of the operator's digit pad within the null zone 212 without causing an unwanted switch response in any of the electrodes surrounding the null zone.

Each of the electrodes has a side facing the null zone which is about one half inch in width, so that when the operator slides his finger digit pad from the null zone onto a particular electrode, only that electrode is affected by the movement, and no unwanted electrode switching response occurs. By contrast, when the operator's digit pad is centered over the narrow non-conductive strips between adjacent electrodes, such that the digit pad now resides substantially entirely over both electrodes, a dual switching response occurs, and the outcome of the dual switch activation is used to cause a different response than would occur when either electrode is activated singly.

Figure 12:
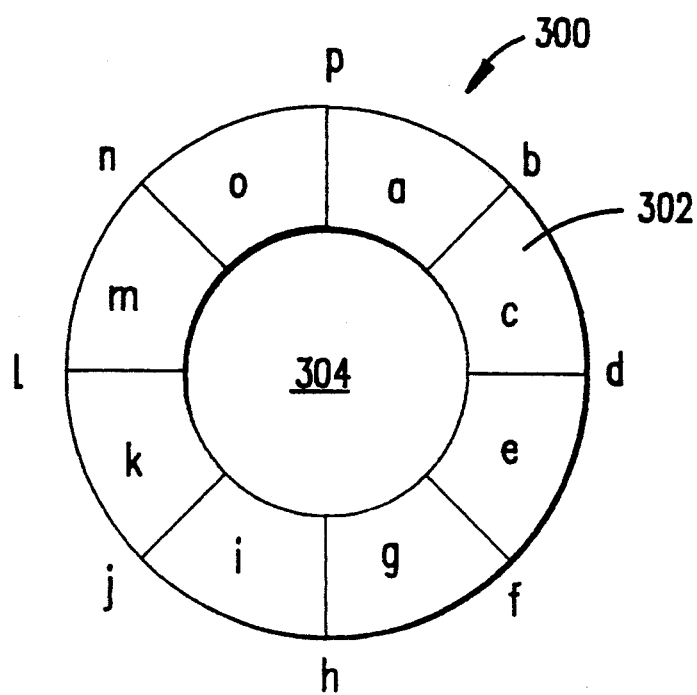
FIG. 12 is a view of another embodiment of the present invention.

In the sliding contact switch pad of the invention shown in FIG. 11, and the circular shaped sliding contact touch pad 300 shown in FIG. 12 with electrodes 302 and null zone 304, eight electrodes separated from each other by non-conductive strips are shown surrounding a central null zone that is large enough to accommodate the operator's digit pad without causing a control switch response in any of the surrounding electrodes. The electrodes of these two embodiments may be used to produce a letter response in the ultimate response device. Such a switching device could be useful in typewriter or computer keyboards in place of the conventional keys, devices of a similar nature. As indicated, placing the digit pad on a single electrode produces a final switch response of one particular letter and placing the digit pad in an intermediate position between two electrodes, such that a dual electrode switching response is generated, produces an entirely different final output switching response. Thus, as is clearly indicated, placing the digit pad entirely over electrode 206 causes only electrode 206 to yield a final control switching response that would cause the letter "a" to be printed whereas, placing the operator's digit pad above the narrow non-conductive strip between electrodes 206 and 208 would result in covering a portion of both electrodes 206 and 208, to cause a dual switching response in both of these electrodes. The electronic response circuitry would interpret this dual response as calling for the letter "p" to be printed. In this way, sixteen letters of the alphabet could be called forth by a sliding contact control device of the invention operable by a single sliding finger pad, by utilizing only eight electrodes arrayed about a null zone.

In one variation of the device, the null zone may be fitted with some form of pressure activated switching mechanism, such as switch PS depicted in FIG. 1, that does not respond to the normal low pressure sliding passage of the digit pad across the null zone, but rather, requires some minimum added pressure contact to elicit a response. Such an improvement in the device could be used, for example, to elicit a space bar equivalent effect, thereby providing a convenient way to separate words while still avoiding the necessity of removing the operator's finger from sliding contact with the control pad to accomplish word separation.

It is not difficult to visualize a full complement of sliding contact control pads of the type described above, fitted into a flat panel array similar to a keyboard in configuration, to provide a sliding contact switch control system that can be operated by one or more fingers of one or both hands. One of the advantages of this type of controller is that there is no need for the operator to lift his wrist from a support surface while operating one or more of the sliding contact control devices.

The embodiments which have been described herein are but some of several which utilize this invention and are set forth here by way of illustration but not of limitation. It is apparent that many other embodiments which will be readily apparent to those skilled in the art may be made without departing materially from the spirit and scope of this invention.

We claim:

1. A sliding contact touch activated switch pad, comprising:
a plurality of sensors disposed about an intersection of at least two intersecting axes, each sensor of said plurality of sensors being a capacitive sensor and being separated from an adjacent sensor of said plurality of sensors by a non-conductive area;
a null zone disposed concentric with said plurality of sensors and located between said intersection and said plurality of sensors; and
means electrically connected to each sensor for producing (a) a final first-output signal when a controlling object is in conductive engagement with a sensor or a pair of adjacent sensors, and (b) a final second-output signal when said controlling object is not in conductive engagement with a sensor or pair of sensors.

2. The sliding contact touch activated switch pad of claim 1 wherein there are two intersecting axes which are orthogonal axes.

3. The sliding contact touch activated switch pad of claim 1 wherein said plurality of sensors comprise a ring-like configuration of capacitive sensors disposed symmetrically about said intersection, each sensor of said ring-like configuration of capacitive sensors being separated from an adjacent sensor of said ring-like configuration of capacitive sensors by a non-conductive strip.

4. The sliding contact touch activated switch pad of claim 3 wherein said producing means is electrically connected to each sensor of said ring-like configuration of capacitive sensors for producing (a) a final-first output signal when a controlling object is in conductive engagement with at least one sensor, and (b) a final second output-signal when said controlling object is not in conductive engagement with a sensor.

5. The sliding contact touch activated switch pad of claim 4 wherein said non-conductive strip is radially oriented relative to said intersection.

6. The sliding contact touch activated switch pad of claim 1 wherein said plurality of sensors comprise a ring-like configuration of four capacitive electrodes, each electrode of said four capacitive electrodes occupying substantially all of a quadrant of said ring-like configuration, said four capacitive electrodes being arranged symmetrically about said intersection, each electrode being separated from an adjacent electrode by a non-conductive strip.

7. The sliding contact touch activated switch pad of claim 1 wherein said plurality of sensors and said null zone are part of an upper surface of a housing, and further comprising means adjacent said upper surface for guiding said controlling object relative to said plurality of sensors.

8. The sliding contact touch activated switch pad of claim 7 wherein said guiding means comprises a plurality of raised ribs which are selectively disposed upon said upper surface.

9. The sliding contact touch activated switch pad of claim 8 wherein said guiding means also comprises a plurality of indentations which are selectively disposed upon said upper surface.

10. The sliding contact touch activated switch pad of claim 8 wherein said guiding means comprises a plurality of raised ribs which are selectively disposed upon said upper surface.

11. The sliding contact touch activated switch pad of claim 1 wherein one output signal is a logic low signal and the other output signal is a logic high signal.

12. The sliding contact touch activated switch pad of claim 11 wherein said producing means includes (a) a respective resistor electrically connected to each sensor and (b) means electrically connected to each respective resistor for applying a stream of narrow-negative going voltage pulses to each respective sensor through a respective resistor, said logic low signal being produced when the voltage value of a sensor is greater than a fixed threshold value at the time of sampling, which results from said controlling object being in conductive engagement with a sensor, and said logic high signal being produced when the voltage value of a respective sensor is less than said fixed threshold value at the time of sampling which results from said controlling object not being in conductive engagement with a sensor.

13. The sliding contact touch activated switch pad of claim 12 wherein said first final-output signal is a logic low signal and said second final-output signal is a logic high signal.

14. The sliding contact touch activated switch pad of claim 1, wherein said producing means includes a plurality of dedicated capacitance sensing circuits, each dedicated capacitance sensing circuit of said plurality of dedicated capacitance sensing circuits being electrically connected to a respective sensor, each dedicated capacitance sensing circuit producing (a) a final first-output signal when a controlling object is in conductive engagement with a respective sensor, and a final second-output signal when said controlling object is not in conductive engagement with a respective sensor.

15. The sliding contact touch activated switch pad of claim 14 wherein each dedicated capacitance sensing circuit includes a respective resistor electrically connected to a respective sensor and wherein said producing means further includes means electrically connected to each respective resistor for applying a stream of narrow voltage pulses to each respective sensor through a respective resistor, said final first-output signal being produced when the voltage value of a respective sensor at the time of sampling, is greater than a fixed threshold value, and said final second-output signal being produced when the voltage value of a respective sensor at the time of sampling is less than said fixed threshold value.

16. The sliding contact touch activated switch pad of claim 15 wherein one final output signal is a logic low signal and the other final output signal is a logic high signal.

17. The sliding contact touch activated switch pad of claim 16 wherein each dedicated capacitance sensing circuit includes means for preventing occasional noise input at a respective sensor from affecting said first final-output signal and said second final-output signal.

18. The sliding contact touch activated switch pad of claim 17 wherein said preventing means is a voltage-time integrating low-pass filter.

19. The sliding contact touch activated switch pad of claim 15 wherein each dedicated capacitance sensing circuit includes means for sampling periodically the state of the switch pad and providing an output signal state that is representative of the time average of more than 10 consecutive samplings.

20. The sliding contact touch activated switch pad of claim 15 wherein each dedicated capacitance sensing circuit includes means for providing a plurality of output signals each the result of time averaging, via a low pass filter, of more than 10 samplings of the respective sensor pad, such samplings made by applying a narrow negative voltage pulse to the sensor pad through a resistor and latching the condition of whether or not the pad voltage exceeded a threshold voltage at the end of the pulse, the final output value of said final first-output signals and said final second output signals being dependent upon the cumulative results of the voltage-time integration of said samplings.

21. The sliding contact touch activated switch pad of claim 15 wherein each dedicated capacitance sensing circuit includes means for excluding signals representing unwarranted activation of one or more of said sensors.

22. The sliding contact touch activated switch pad of claim 15 wherein each dedicated capacitance sensing circuit includes means for excluding signals representing the coincident activation of more than two physically adjacent sensors.

23. The sliding contact touch activated switch pad of claim 15 wherein each dedicated capacitance sensing circuit includes means for excluding signals representing the coincident activation of opposing sensor pads.

24. In a sliding contact touch activated switch pad wherein conductive engagement of one or more sensors by a controlling object causes a final control switching response, wherein the improvement comprises:

means disposed about a point for conductive engagement by a controlling object, including a plurality of sensors disposed about said point, each sensor being separated from an adjacent sensor by a non-conductive strip, each sensor being of sufficient size to accommodate placement of said controlling object thereon to effect a final control switching response without causing a final control switching response in another sensor of said plurality of sensors; and means disposed between said point and said conductive engagement means for non-conductive engagement by said controlling object, including a surface of sufficient size to accommodate placement of said controlling object thereon without affecting a final control switching response in any sensor of said plurality of sensors.

25. The sliding contact touch activated switch pad of claim 24 wherein said point is located at the intersection of at least two intersecting axes and said plurality of sensors is disposed symmetrically about said intersection.

26. The sliding contact touch activated switch pad of claim 24 wherein each sensor comprises a side adjacent said non-conductive engagement means, said sides collectively enclosing said non-conductive engagement means, each side being of sufficient size to accommodate sliding passage of said controlling object to and from a respective sensor without causing a final control switching response in another sensor of said plurality of sensors.

27. The sliding contact touch activated switch pad of claim 26 wherein said surface is at least 0.66 inches wide in any direction.

28. The sliding contact touch activated switch pad of claim 26 wherein each side is at least one half inch wide.

29. The sliding contact touch activated switch pad of claim 26 wherein said surface has a perimeter which is at least equal to the number of adjoining sensors multiplied by one half inch.

30. The sliding contact touch activated switch pad of claim 26 wherein said surface includes a pressure actuated switch.

31. The sliding contact touch activated switch pad of claim 24 wherein said plurality of sensors is disposed about said point in a racetrack configuration, said surface being elongated.

32. The sliding contact touch activated switch pad of claim 26 further including means electrically connected to said conductive engagement means for directing a controlled object in a manner which is dependent upon the position of said controlling object relative to said non-conductive engagement means when said controlling object engages said conductive engagement means.

33. A controller comprising a plurality of electrically independent conductive touch sensitive electrodes surrounding a non-conductive center null zone of sufficient size to accommodate an operator's digit pad thereon without affecting final control output response of any of said electrodes, each of said electrodes being switch responsive to the placement of at least a part of the operator's digit pad thereon, so as to produce a single final output switch response that is indicative of the position of the operator's digit pad with respect to the null zone when a single electrode is touched, and a dual final output switch response that is indicative of the position of the operator's digit pad with respect to the null zone when at least a part of the operator's digit pad comes in contact with each of a pair of adjacent electrodes.

* * * * *